(12) United States Patent
Farnworth et al.

(10) Patent No.: US 6,893,804 B2
(45) Date of Patent: May 17, 2005

(54) SURFACE SMOOTHING OF STEREOLITHOGRAPHICALLY FORMED 3-D OBJECTS

(75) Inventors: Warren M. Farnworth, Nampa, ID (US); Kevin G Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/299,620

(22) Filed: Nov. 18, 2002

(65) Prior Publication Data

US 2003/0068584 A1 Apr. 10, 2003

Related U.S. Application Data

(63) Continuation of application No. 09/634,239, filed on Aug. 8, 2000, now Pat. No. 6,482,576.

(51) Int. Cl.⁷ .............................. G03F 7/40; B29C 39/12
(52) U.S. Cl. ....................... 430/322; 430/269; 430/319; 430/945; 264/401
(58) Field of Search ................................ 430/269, 322, 430/319; 264/401

(56) References Cited

U.S. PATENT DOCUMENTS

| | | |
|---|---|---|
| 4,305,204 A | 12/1981 | Toggart et al. |
| 4,929,402 A | 5/1990 | Hull |
| 4,996,010 A | 2/1991 | Modrek |
| 5,076,974 A | 12/1991 | Modrek et al. |
| 5,143,663 A | 9/1992 | Leyden et al. |
| 5,173,220 A | 12/1992 | Reiff et al. |
| 5,209,878 A | 5/1993 | Smalley et al. |
| 5,217,653 A | 6/1993 | Mashinsky et al. |

(Continued)

OTHER PUBLICATIONS

Miller et al., "Maskless Mesoscale Materials Deposition", Deposition Technology, Sep. 2001, pp. 20–22.
Miller, "New Laser–Directed Deposition Technology", Microelectronic Fabrication, Aug. 2001, p. 16.
Webpage, Object Prototyping the Future, Object FullCure700 Series, 1 page, no date given.
Webpage, Object Prototyping the Future, How it Works, 2 pages, 2003 Copyright Date.
U.S. Appl. No. 09/589,841, filed Jun. 8, 2000, entitled "Stereolithographic Methods for Forming a Protective Layer on a Semiconductor Device Substrate and Substrates Including Protective Layer So Formed", inventor Farnworth et al.
U.S. Appl. No. 09/651,930, filed Aug. 31, 2000, entitled "Semiconductor Device Including Leads in Communication with Contact Pads Thereof and a Stereolithographically Fabricated Packages Substantially Encapsulating the Leads and Methods for Fabricating the Same", inventor Salman Akram.

(Continued)

*Primary Examiner*—Cynthia Hamilton
(74) *Attorney, Agent, or Firm*—TraskBritt

(57) ABSTRACT

A stereolithographic method and apparatus for forming polymeric structures comprising a plurality of overlying layers, each layer formed by polymerizing a thin layer of liquid photopolymer on a prior layer. Crevices formed at the layer interfaces are filled by a stereolithographic method comprising lifting the multilayered structure from the liquid photopolymer, draining excess liquid therefrom, tilting the structure to provide an acute angle of incidence between an incident radiation beam and a side wall of the object, and applying radiation to the crevice to polymerize at least the surface of a quantity of liquid photopolymer therein. The structure may then be subjected to a separate final full cure to fully harden the structure. An exemplary use is the packaging of electronic components and the like.

15 Claims, 9 Drawing Sheets

U.S. PATENT DOCUMENTS

| | | | |
|---|---|---|---|
| 5,234,636 A | 8/1993 | Hull et al. | |
| 5,264,061 A | 11/1993 | Juskey et al. | |
| 5,350,713 A | 9/1994 | Liang | |
| 5,434,745 A | 7/1995 | Shokrgozar et al. | |
| 5,460,758 A | 10/1995 | Langer et al. | |
| 5,484,314 A | 1/1996 | Farnworth | |
| 5,545,367 A | 8/1996 | Bae et al. | |
| 5,573,721 A | 11/1996 | Gillette | |
| 5,622,811 A | 4/1997 | Ogue et al. | |
| 5,705,117 A | 1/1998 | O'Connor et al. | |
| 5,893,726 A | 4/1999 | Farnworth et al. | |
| 5,965,079 A | 10/1999 | Manners | |
| 6,107,008 A | 8/2000 | Howell et al. | |
| 6,251,488 B1 | 6/2001 | Miller et al. | |
| 6,259,962 B1 | 7/2001 | Gothait | |
| 6,268,584 B1 | 7/2001 | Keicher et al. | |
| 6,326,698 B1 | 12/2001 | Akram | |
| 6,337,122 B1 | 1/2002 | Grigg et al. | |
| 6,391,251 B1 | 5/2002 | Keicher et al. | |
| 6,432,752 B1 | 8/2002 | Farnworth | |
| 6,482,576 B1 * | 11/2002 | Farnworth et al. | 430/322 |
| 6,489,007 B2 | 12/2002 | Grigg et al. | |
| 6,514,798 B2 | 2/2003 | Farnworth | |
| 6,524,346 B1 | 2/2003 | Farnworth | |
| 6,544,465 B1 | 4/2003 | Farnworth et al. | |
| 6,544,821 B2 | 4/2003 | Akram | |
| 6,544,902 B1 | 4/2003 | Farnworth | |
| 6,549,821 B1 | 4/2003 | Farnworth et al. | |
| 6,562,278 B1 | 5/2003 | Farnworth et al. | |
| 6,585,927 B2 | 7/2003 | Grigg et al. | |
| 6,593,171 B2 | 7/2003 | Farnworth | |
| 6,607,689 B1 | 8/2003 | Farnworth | |
| 6,635,333 B2 | 10/2003 | Grigg et al. | |
| 2001/0024129 A1 | 9/2001 | Akram et al. | |
| 2001/0038144 A1 | 11/2001 | Grigg | |
| 2001/0051395 A1 | 12/2001 | Grigg | |
| 2002/0066966 A1 | 6/2002 | Farnworth | |
| 2002/0098623 A1 | 7/2002 | Akram | |
| 2002/0171177 A1 | 11/2002 | Kritchman et al. | |
| 2002/0182782 A1 | 12/2002 | Farnworth | |
| 2002/0195748 A1 | 12/2002 | Farnworth | |
| 2003/0003179 A1 | 1/2003 | Farnworth et al. | |
| 2003/0043360 A1 | 3/2003 | Farnworth | |
| 2003/0072926 A1 | 4/2003 | Grigg et al. | |
| 2003/0077418 A1 | 4/2003 | Grigg et al. | |
| 2003/0089999 A1 | 5/2003 | Akram | |
| 2003/0092220 A1 | 5/2003 | Akram | |
| 2003/0093173 A1 | 5/2003 | Farnworth et al. | |
| 2003/0102566 A1 | 6/2003 | Farnworth | |
| 2003/0129787 A1 | 7/2003 | Farnworth | |
| 2003/0151167 A1 | 8/2003 | Kritchman et al. | |
| 2003/0155693 A1 | 8/2003 | Farnworth et al. | |
| 2003/0201531 A1 | 10/2003 | Farnworth et al. | |
| 2003/0203158 A1 | 10/2003 | Farnworth et al. | |
| 2003/0205849 A1 | 11/2003 | Farnworth | |
| 2003/0207213 A1 | 11/2003 | Farnworth | |

OTHER PUBLICATIONS

U.S. Appl. No. 10/370,755, filed Feb. 20, 2003, "Chip Scale Package Structures and Methods of Forming Conductive Bumps Thereon", inventor Warren M. Farnworth.

U.S. Appl. No. 10/608,749, filed Jun. 26, 2003, entitled "Methods for Labeling Semiconductor Device Components", inventor Grigg et al.

U.S. Appl. No. 10/619,918, filed Jul. 15, 2003, entitled "Stereolithographic Methods for Fabricating Hermetic Semiconductor Device Packages and Semiconductor Devices Including Stereolithographically Fabricated Hermetic Packages", inventor Warren M. Farnworth.

U.S. Appl. No. 10/663,402, filed Sep. 16, 2003, entitled "Processes for Facilitating Removal of Stereolithographically Fabricated Objects from Platens of Stereolithographic Fabrication Equipment, Object Release Elements, for Effecting such Processes, Systems and Fabrication Processes Employing the Object Release Elements, and Objects Which Have Been Fabricated Using the Object Release Elements", inventor Farnworth et al.

U.S. Appl. No. 10/672,098, filed Sep. 26, 2003, entitled "Apparatus and Methods for Use in Stereolithographic Processing of Components and Assemblies", inventor Warren M. Farnworth.

U.S. Appl. No. 10/690,417, filed Oct. 20, 2003, entitled "Methods of Coating and Singulating Wafers and Chip-Scale Packages Formed Therefrom", inventor Farnworth et al.

* cited by examiner

SURFACE SMOOTHING OF STEREOLITHOGRAPHICALLY FORMED 3-D OBJECTS

CROSS-REFERENCE TO RELATED APPLICATION

This application is a continuation of application Ser. No. 09/634,239, filed Aug. 8, 2000, now U.S. Pat. No. 6,482,576, issued Nov. 19, 2002.

BACKGROUND OF THE INVENTION

1. Field of the Invention

The present invention relates generally to stereolithography and, more specifically, to the use of stereolithography in forming multilayer structures with vertical or near-vertical sides, such structures including packages for semiconductor devices and the like. Most particularly, the present invention relates to forming multilayer structures with sides of enhanced smoothness.

2. State of the Art

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually being effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semisolid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated or fixed, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer which can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by inkjet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques.

To the inventors' knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

In the electronics industry, state-of-the-art packaging of semiconductor dice is an extremely capital-intensive proposition. In many cases, discrete semiconductor dice carried on, and electrically connected to, leadframes are individually packaged with a filled polymer material in a transfer molding process. A transfer molding apparatus is extremely expensive, costing at least hundreds of thousands of dollars in addition to the multi-hundred thousand dollar cost of the actual transfer molding dies in which strips of leadframes bearing semiconductor dice are disposed for encapsulation.

Encapsulative packaging of a semiconductor device already mounted on a substrate by molding and other presently used methods may be very difficult, time-consuming and costly. In some cases, the device may be packaged using a so-called "glob-top" material such as a silicone gel, but the package boundaries are imprecisely defined, a dam structure may be required to contain the slumping gel material, and the seal achieved is generally nonhermetic.

SUMMARY OF THE INVENTION

The present invention includes a method of forming a precisely dimensioned structure from a photopolymer material by a stereolithographic process. The structure is formed by creating one or more layers of at least partially polymerized material adjacent a preformed electronic component or other small component with a high degree of precision to create a wall adjacent thereto or, optionally, an encapsulative package therefor. For example, a semiconductor die may be provided with a protective structure in the form of a layer of dielectric material having a controlled thickness or depth over or adjacent one or more surfaces thereof. As used herein, the term "package" as employed with reference to electrical components includes partial, as well as full, covering or encapsulation of a given semiconductor die surface with a dielectric material, and specifically includes fabrication of a semiconductor die configured in a so-called "chip-scale" package, wherein the package itself, including the die, is of substantially the same dimensions as, or only slightly larger than, the die itself.

The packaging method of the present invention may be applied, by way of example and not limitation, to a die mounted to a leadframe (having a die mounting paddle or in a paddle-less leads-over-chip (LOC), or in a leads-under-chip (LUC) configuration), mounted to a carrier substrate in a chip-on-board (COB) or board-on-chip (BOC) arrangement, a semiconductor die in a so-called "flip-chip" configuration, or in other packaging designs, as desired.

The present invention employs computer-controlled, 3-D CAD initiated, stereolithographic techniques to apply protective and alignment structures to an electronic component such as a semiconductor die. A dielectric layer or layer segments may be formed over or adjacent a single die or substantially simultaneously over or adjacent a large number of dice or die locations on a semiconductor wafer or other large-scale semiconductor substrate, individual dice or groups of dice then being singulated therefrom. The package may be formed to cover the lateral surfaces as well as the upper and/or lower surfaces of a semiconductor die.

Precise mechanical alignment of singulated semiconductor dice or larger semiconductor substrates having multiple die locations is not required to practice the method of the present invention, which includes the use of machine vision to locate dice and features or other components thereon or associated therewith (such as leadframes, bond wires, solder bumps, etc.) or features on a larger substrate for alignment and material disposition purposes.

In one embodiment, packaging for electronic components according to the invention is fabricated using precisely focused coherent electromagnetic radiation in the form of an ultraviolet (UV) wavelength laser under control of a computer and responsive to input from a machine vision system such as a pattern recognition system to fix or cure a liquid material in the form of a photopolymer.

A multilayer package structure is formed by placing an object in a bath of photopolymer material to a depth forming a thin liquid layer which will comprise the lowermost layer of the package structure. A laser beam of coherent radiation is controllably passed over selected portions of the thin layer of photopolymer material for partial polymerization thereof. The object is then lowered to a depth to form a second thin liquid layer of photopolymer material over the at least partially polymerized prior layer, followed by laser exposure. A stack of at least partially polymerized layers is thus formed, comprising as many consecutive, at least partially superimposed layers as are required to achieve the desired structure height.

In the structure fabrication process, small interstitial horizontal crevices are defined at the joints between adjacent layers of the structure. Unpolymerized liquid photopolymer material forms a meniscus in each of the crevices. As such uncured material is typically rinsed from the structure after it is removed from the bath, a subsequent complete cure of the photopolymer of the structure outside of the bath does not fill the crevices, but leaves such crevices as unsightly, rough surface features which reduce the effective wall thickness of the structure and may also undesirably collect dust, dirt and moisture.

The present invention includes methods and apparatus for substantially eliminating these interlayer crevices and smoothing the joints between the structure layers. Following the exemplary formation of a desired multilayer package structure about an object such as a semiconductor die, the die with surrounding package structure is removed from the photopolymer bath and excess liquid photopolymer drained therefrom. The object is then tilted by about 5–90 degrees from the horizontal so as to reorient the side walls thereof to face at least partially upwardly, and the crevices between horizontal at least partially cured photopolymer layers, each containing a meniscus of unpolymerized liquid photopolymer, are subjected to radiation of an appropriate wavelength to polymerize the liquid meniscus material and smooth the exterior surfaces of the package structure.

It is also contemplated that the present invention has utility with respect to the formation of stand-alone structures and not merely structures fabricated in association with pre-existing objects, such as the aforementioned semiconductor dice or other electronic components.

DETAILED DESCRIPTION OF THE INVENTION

Figure 1:
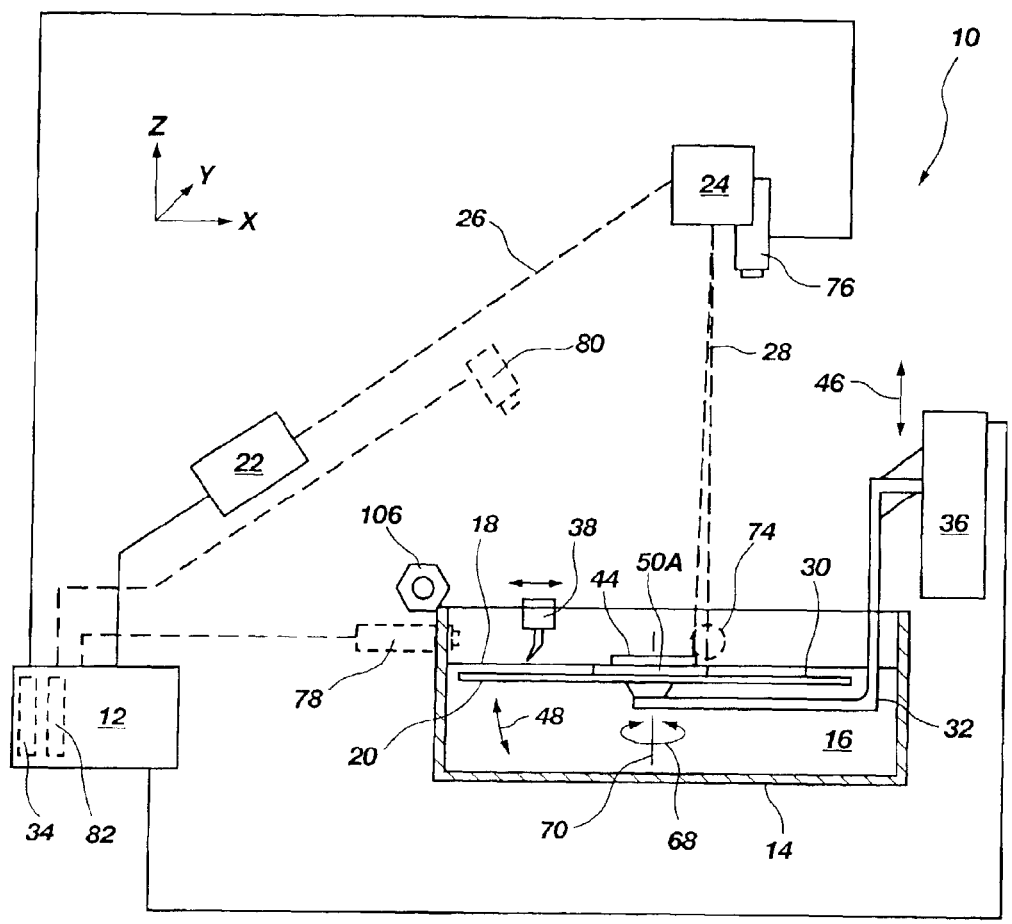
FIG. 1 is a schematic side elevation of an exemplary stereolithography apparatus of the invention suitable for use in practicing the method of the present invention.

FIG. 1 depicts schematically various components and operation of an exemplary stereolithography apparatus 10 modified to create miniature multilayer structures with side walls of perceptibly improved smoothness. Those of ordinary skill in the art will understand and appreciate that apparatus of other designs and manufacture may be modified to practice the method of the present invention. The preferred basic stereolithography apparatus which may be modified in accordance with the present invention, as well as conventional operation of such apparatus, are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836. The disclosure of each of the foregoing patents is hereby incorporated herein by this reference. The stereolithographic apparatus may be modified as described in U.S. Pat. No. 6,549,821 assigned to the assignee of the present invention and hereby incorporated herein by this reference. This earlier application relates to the use of a "machine vision" system with suitable programming of the computer controlling the stereolithographic process, eliminating the need for accurate positioning or mechanical alignment of workpieces to which material is stereolithographically applied, and expands the use to large numbers of workpieces which may have differing orientation, size, thickness and surface topography.

While the workpieces employed in the practice of the preferred embodiment of the method of the invention are, by way of example only, semiconductor dice, wafers, partial wafers, other substrates of semiconductor material or carrier substrates bearing integrated circuits on dice or other semiconductor structures, the method and apparatus of the invention are applicable to fabricating other products including workpieces having the aforementioned variations in orientation, size, thickness and surface topography.

Figure 1A:
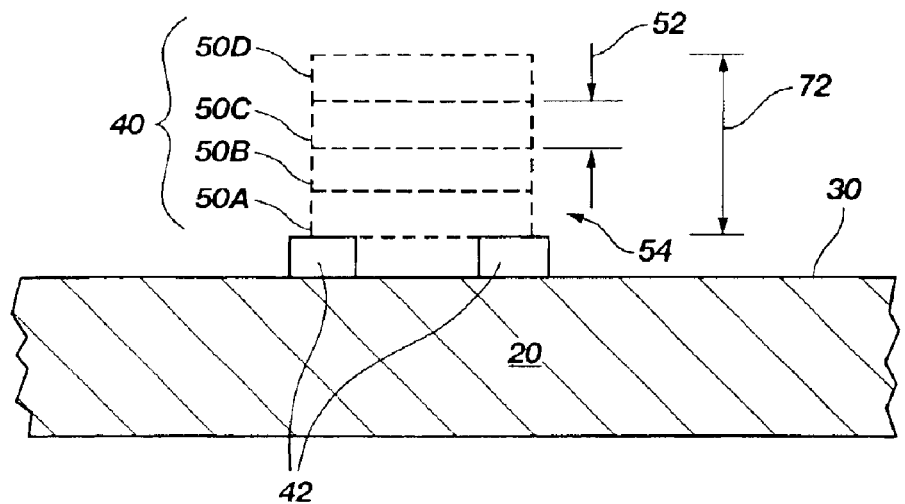
FIG. 1A is an enlarged cross-sectional side view of a portion of the support platform of a stereolithographic apparatus of the invention forming a simple object.
Figure 1B:
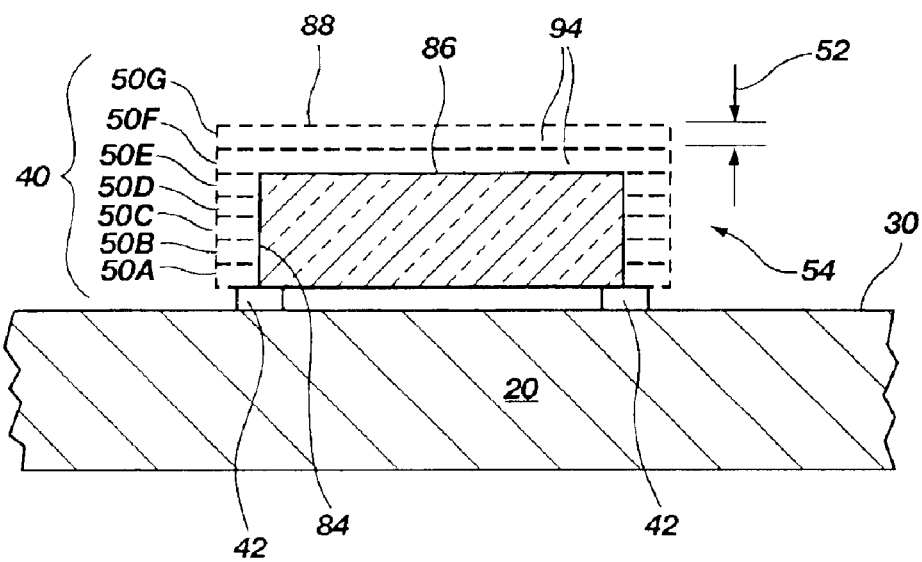
FIG. 1B is an enlarged cross-sectional side view of a portion of the support platform of a stereolithographic apparatus of the invention forming a package on a semiconductor die.

With reference to FIGS. 1, 1A, and 1B, a 3-D CAD drawing of a structure 40 to be fabricated in the form of a data file is placed in the memory of a computer 12 controlling the operation of apparatus 10, if computer 12 is not a CAD computer in which the original object design is effected. In other words, an object design may be effected in a first computer in an engineering or research facility and the data files transferred via wide or local area network, tape, disc, CD-ROM or otherwise as known in the art to computer 12 of apparatus 10 for object fabrication.

The data is preferably formatted in an STL (for StereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of a structure 40 are defined as a mesh of interconnected triangles.

Apparatus 10 also includes a reservoir 14 (which may comprise a removable reservoir interchangeable with other reservoirs containing different materials) of liquid material 16 to be employed in fabricating the intended structure 40. In the currently preferred embodiment, the liquid material 16 is a photo-curable polymer (hereinafter "photopolymer") responsive to light in the UV wavelength range. The surface level 18 of the liquid material 16 is automatically maintained at an extremely precise, constant magnitude by devices known in the art responsive to output of sensors within apparatus 10 and preferably under control of computer 12. U.S. Pat. No. 5,174,931, referenced above and previously incorporated herein by reference, discloses one suitable level control system.

A support platform or elevator 20 is shown, having an upper surface 30 and moved by platform actuator 36. Platform 20 is precisely vertically movable by actuator 36 via platform controller 32 in fine, repeatable increments responsive to control of computer 12, and is located for movement 46 downward into and upward out of liquid material 16 in reservoir 14. In addition, under the actuation of actuator 36, platform 20 is controllably tiltable by movement 48 to an acute angle 62 with the horizontal plane (see FIG. 7). Furthermore, in a preferred embodiment, platform 20 is rotatable by movement 68 about a vertical axis 70. The platform 20 and/or structures 40 placed on the platform comprise a base upon which structures 40 are formed by a stereolithographic process in this invention.

A laser 22 for generating a beam of light 26 in the UV wavelength range has associated therewith appropriate optics and galvanometers. The laser beam 26 is reflected by reflective apparatus 24 to shape and define beam 26 into beam 28, which is directed downwardly to the surface 30 of platform 20 and traversed in the X-Y plane, that is to say, in a horizontal plane, in a selected pattern under control of computer 12. Liquid photopolymer material 16 which is exposed to laser beam 28 as it is scanned in an X-Y plane is at least partially cured thereby to at least a semisolid state.

Data from the STL files resident in the memory 34 of computer 12 is manipulated to build a structure 40 one layer 50 at a time. The structure 40 is constructed on a base which may comprise the platform 20, a pre-existing object 44 on the platform 20, or other object. Accordingly, the data mathematically representing structure 40 is divided into subsets, each subset representing a slice or layer 50 of structure 40. This is effected by mathematically sectioning the 3-D CAD model into a plurality of horizontal layers 50, a "stack" of such layers representing structure 40. Each slice or layer 50 may be from about 0.0001 inch to about 0.0300 inch thick. The preferred range of layer thickness is from about 0.002 inch to about 0.020 inch. A slice or layer 50 with a relatively small layer thickness 52 promotes higher resolution by enabling better reproduction of fine vertical surface features of structure 40. On the other hand, a structure 40 formed of layers 50 having greater thickness 52 will have fewer layers; thus, it is constructed with fewer scans of the laser beam 28 and the overall production rate is typically higher.

In some instances, a base support or supports 42 for a structure 40 or pre-existing object 44 may also be programmed as a separate STL file. The use of such base supports 42 is exemplified in FIGS. 1A and 1B, which are enlarged views of a portion of the platform 20 on which a structure 40 is to be fabricated. In FIG. 1A, a structure 40 is to be constructed on prior-formed base supports 42. The exemplary structure 40 is depicted as formed of four layers 50A, 50B, 50C and 50D, each formed by a scan of a laser. In FIG. 1B, a structure 40 in the form of a protective polymeric package is to be formed by STL over a pre-existing object 44, e.g., a semiconductor die. Base supports 42 are first fabricated on surface 30 of the platform 20 to support and attach the die to the platform. Then, the overlying structure 40 is formed by a plurality of laser scans, each at a higher elevation. Such supports 42 facilitate fabrication of a structure 40 with reference to a perfectly horizontal plane above the surface 30 of platform 20. The structure 40 may be constructed upon or adjacent to a pre-existing object 44 such as a semiconductor die, electronic substrate, or the like. The formation of a base support 42 between the pre-existing object 44 and the platform surface 30 enables rigid and precise positioning of the pre-existing object 44 in a desired precise orientation on the platform surface.

Where a "recoater" blade 38 is employed as described below, the interposition of base supports 42 precludes inadvertent contact of blade 38 with platform surface 30.

Before fabrication of structure 40 is initiated with apparatus 10, the primary STL file for structure 40 and the file for base support(s) 42 (if used) are merged. It should be recognized that, while reference has been made to a single structure 40, multiple structures 40 may be concurrently fabricated on surface 30 of platform 20. In such an instance, the STL files for the various structures 40 and supports 42, if any, are merged. Operational parameters for apparatus 10 are then set, for example, to adjust the size (diameter, if circular) of the laser light beam 28 used to cure liquid material 16.

Before initiation of a first support layer for a support 42, or a first layer 50A for a structure 40 is commenced, computer 12 automatically checks and, if necessary, adjusts by means known in the art as referenced above, the surface level 18 of liquid material 16 in reservoir 14 to maintain same at an appropriate focal length for laser beam 28. U.S. Pat. No. 5,174,931, referenced above and previously incorporated by reference, discloses one suitable level control system. Alternatively, the height of reflective apparatus 24 may be adjusted responsive to a detected surface level 18 to cause the focal point of laser beam 28 to be located precisely at the surface of liquid material 16 at surface level 18 if level 18 is permitted to vary, although this approach is somewhat more complex.

The platform 20 may then be submerged in liquid material 16 in reservoir 14 to a depth equal to the thickness 52 of one layer or slice 50 of the structure 40, and the liquid surface level 18 readjusted as required to accommodate liquid material 16 displaced by submergence of platform 20. Laser 22 is then activated so that laser beam 28 will scan liquid material 16 over surface 30 of platform 20 to at least partially cure (e.g., at least partially polymerize) liquid material 16 at selected locations, defining the boundaries of a first layer 50 (of structure 40 or support 42, as the case may be) and filling in solid portions thereof.

Platform 20 is then lowered by a distance equal to the thickness 52 of a layer 50, and the laser beam 28 scanned to define and fill in the second layer 50B while simultaneously bonding the second layer to the first. The process is then repeated, layer by layer, until structure 40 is completed.

If a recoater blade 38 is employed, the process sequence is somewhat different. In this instance, the surface 30 of platform 20 is lowered into liquid material 16 below surface level 18, then raised thereabove until it is precisely one layer's thickness 52 below blade 38. Blade 38 then sweeps horizontally over surface 30, or (to save time) at least over a portion thereof on which a structure 40 is to be fabricated, to remove excess liquid material 16 and leave a film thereof of the precise, desired thickness 52 on surface 30. Platform 20 is then lowered so that the surface of the film and material level 18 are coplanar and the surface of the liquid material 16 is still. Laser 22 is then initiated to scan with laser beam 28 and define the first layer 50A. The process is repeated, layer by layer, to define each succeeding layer 50 and simultaneously bond same to the next lower layer 50 until structure 40 is completed. A more detailed discussion of this sequence and apparatus for performing same is disclosed in U.S. Pat. No. 5,174,931, previously incorporated herein by reference.

As an alternative to the above approach to preparing a layer of liquid material 16 for scanning with laser beam 28, a layer of liquid material 16 may be formed on surface 30 by lowering platform 20 to flood liquid material 16 over surface 30 or over the highest completed layer 50 of structure 40, then raising platform 20 and horizontally traversing a so-called "meniscus" blade across the platform 20 (or just the formed portion of structure 40) one layer thickness 52 thereabove, followed by initiation of laser 22 and scanning of beam 28 to define the next higher layer 50.

Yet another alternative to layer preparation of liquid material 16 is to merely lower platform 20 to a depth equal to that of a layer of liquid material 16 to be scanned, and then traverse a combination flood bar and meniscus bar assembly (not shown) horizontally over platform 20 (or merely over structure 40) to substantially concurrently flood liquid material 16 over platform 20 and define a precise layer thickness 52 of liquid material 16 for scanning.

All of the foregoing methods and apparatus for liquid material flooding and layer thickness control are known in the art.

Each layer 50 of structure 40 is preferably built by first defining any internal and external object boundaries of that layer 50 with laser beam 28, then hatching solid areas of structure 40 with laser beam 28. If a particular part of a particular layer 50 is to form a boundary of a void in the structure 40 above or below that layer 50, then the laser beam 28 is scanned in a series of closely-spaced, parallel vectors so as to develop a continuous surface or skin with improved strength and resolution. The time it takes to form each layer 50 depends upon its geometry, surface tension and viscosity of liquid material 16, thickness 52 of the layer, and laser scanning speed.

In practicing the present invention, the stereolithography apparatus 10 preferably comprises a commercially available STL system which is modified by the invention to enable smoothing of vertical sides 54 of STL-formed structures 40. For example and not by way of limitation, the SLA-250/50HR, SLA-5000 and SLA-7000 stereolithography systems, each offered by 3D Systems, Inc, of Valencia, Calif., are suitable for modification. Liquid photopolymer materials 16 believed to be suitable for use in practicing the present invention include Cibatool SL 5170 and SL 5210 resins for the SLA-250/50HR system, Cibatool SL 5530 resin for the SLA-5000 system, and Cibatool SL 7510 resin for the 7000 system. All of these resins are available from Ciba Specialty Chemicals Inc. By way of example and not limitation, the layer thickness of liquid material 16 to be formed, for purposes of the invention, may be on the order of about 0.0001 to about 0.030 inch and, more preferably, from about 0.001 to about 0.020 inch, with a high degree of uniformity over a field on a surface 30 of a platform 20. It should be noted that layers 50 having differing thicknesses 52 may be used to construct a structure 40, so as to form a structure 40 of a precise, intended total height 72 or to provide different material thicknesses 52 for different portions of the structure 40.

The size of the laser beam "spot" 74 impinging on the surface of liquid material 16 to cure same may generally be on the order of 0.002 inch to 0.008 inch, using presently available STL equipment. Resolution is preferably about +0.0003 inch in the X-Y plane (parallel to surface 30) over at least a 0.5 inch×0.25 inch field from a center point, permitting a high resolution scan effectively across a 1.0 inch×0.5 inch area. Of course, it is desirable to have substantially this high a resolution across the entirety of surface 30 of platform 20 to be scanned by laser beam 28. This area may be termed the "field of exposure," such area being substantially coextensive with the vision field of a machine vision system employed in the apparatus of the invention as explained in more detail below. The longer and more effectively vertical the path of laser beam 26, 28, the greater the achievable resolution.

Referring again to FIG. 1 of the drawings, it should be noted that apparatus 10 of the present invention includes a camera 76 which is in communication with computer 12 and preferably located, as shown, in close proximity to optics and scan controller, i.e., reflective apparatus 24 located above surface 30 of platform 20. Camera 76 may be any one of a number of commercially available cameras, such as capacitive-coupled discharge (CCD) cameras available from a number of vendors. Suitable circuitry as required for adapting the output of camera 76 for use by computer 12 may be incorporated in a board 82 installed in computer 12, which is programmed as known in the art to respond to images generated by camera 76 and processed by board 82. Camera 76 and board 82 may together comprise a so-called "machine vision system," and specifically, a "pattern recognition system" (PRS), operation of which will be described briefly below for a better understanding of the present invention. Alternately, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their structures and uses are described, without limitation, in U.S. Pat. Nos. 4,526, 646; 4,543,659; 4,736,437; 4,899,921; 5,059,559; 5,113, 565; 5,145,099; 5,238,174; 5,463,227; 5,288,698; 5,471, 310; 5,506,684; 5,516,023; 5,516,026; and 5,644,245. The disclosure of each of the immediately foregoing references is hereby incorporated by this reference.

Figure 2:
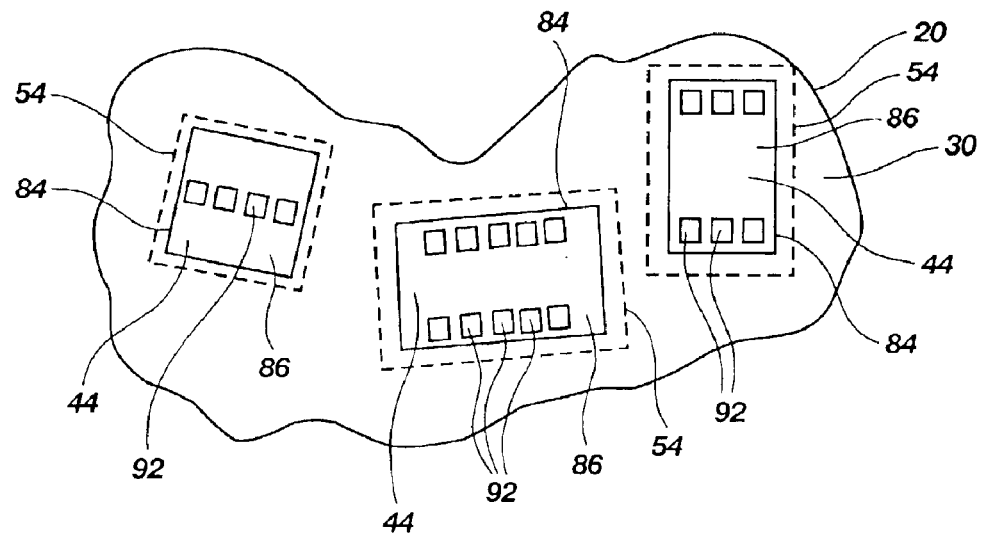
FIG. 2 is a schematic top elevation of a plurality of workpieces in the form of semiconductor dice disposed on a platform of the stereolithographic apparatus of FIG. 1.
Figure 3:
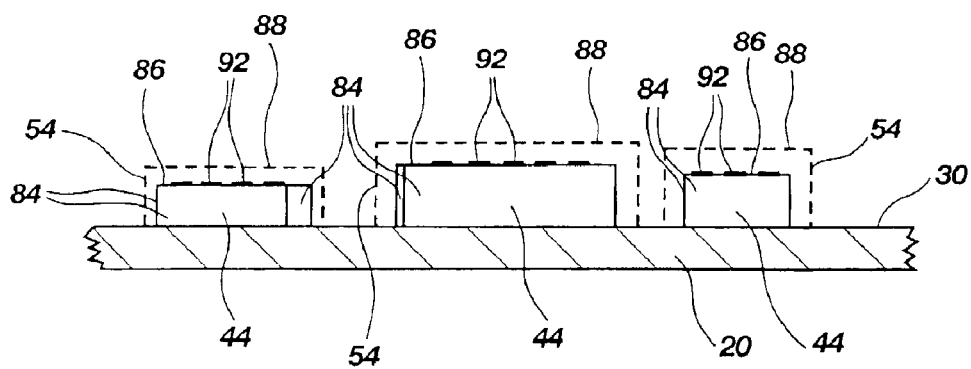
FIG. 3 is a schematic side elevation of a plurality of workpieces in the form of semiconductor dice disposed on a platform of the stereolithographic apparatus of FIG. 1 for packaging in accordance with the present invention.

In order to facilitate practice of the present invention with apparatus 10, a data file representative of the size, configuration, thickness and surface topography of a preexisting object 44, for example, a particular type and design of semiconductor die to be packaged, is placed in the memory 34 of computer 12. If the preexisting object 44, i.e., die, is to be packaged with a leadframe, data representative of the die with attached and electrically connected leadframe is provided. If packaging material in the form of the aforementioned liquid photopolymer material 16 is to be applied only to an upper surface 86 (or portions thereof excluding active surface structures 92) of a die 44 to form upper package surface 88, or to the upper surface 86 and portions or all of the side surfaces 84 of a die, a large plurality of such dice 44 may be placed on surface 30 of platform 20 for packaging, as depicted in FIGS. 2 and 3. If package sides 54 are to be formed, it is desirable that the surface 30 of platform 20 comprise, or be coated or covered with, a material from which the at least partially cured liquid material 16 defining the lowermost layers of the package side wall 54 may be easily released to prevent damage to the packaging. Alternatively, a solvent may be employed to release the package side walls 54 from platform 20 after packaging is completed. Such release and solvent materials are known in the art. See, for example, U.S. Pat. No. 5,447,822 referenced above and previously incorporated herein by reference.

Following mounting of the dice 44 on platform 20, camera 76 is then activated to locate the position and orientation of each die 44 to be packaged by scanning platform 20 and comparing the features of the dice 44 with those in the data file residing in memory 34, the locational and orientational data for each die 44 then also being stored in memory. It should be noted that the data file representing the design size, shape and topography for the dice 44 may be used at this juncture to detect physically defective or damaged dice 44 prior to packaging and to automatically delete such dice 44 from the packaging operation. It should also be noted that data files for more than one type (size, thickness, configuration, surface topography) of die 44 may be placed in computer memory 34 and the computer 12 programmed to recognize not only die locations and orientations, but which type of die 44 is at each location so that liquid material 16 may be cured by laser beam 28 in the correct pattern and to the height required to define package side walls 54 and to provide a package top surface 88 at the correct level and of the correct size and shape over each die 44.

Continuing with reference to FIGS. 1, 1A and 1B of the drawings, dice 44 on platform 20 may then be partially submerged below the surface level 18 of liquid material 16 to a depth the same as, or greater than, the thickness of a first layer of liquid material 16 to be at least partially cured to a semisolid state to form the lowest layer 50A of a package side wall 54 about each of dice 44, and then raised to a depth equal to the layer thickness, the surface of liquid material 16 being allowed to settle. The liquid material 16 selected for use in packaging dice 44 may be one of the above-referenced resins from Ciba Specialty Chemicals Inc. which exhibits a desirable dielectric constant, is of sufficient (semiconductor grade) purity, and which is of sufficiently similar coefficient of thermal expansion (CTE) so that the package structure, i.e., structure 40 and the die 44, itself is not stressed during thermal cycling in testing and subsequent normal operation.

Laser 22 is then activated and scanned to direct beam 28, under control of computer 12, about the periphery of each die 44 to effect the aforementioned partial cure of liquid material 16 to form a first layer 50A. The platform 20 is then lowered into reservoir 14 and raised to another side wall layer thickness-equaling depth increment 52 and the laser 22 activated to add another side wall layer 50B. This sequence continues, layer 50 by layer 50, until the package side walls 54 are built up about dice 44. A final layer or layers 50 may be applied over a portion or the entirety of the upper surface 86 of dice 44, forming an upper package surface 88 thereon. The layer thicknesses 52 may be controlled to differ, depending upon the thickness required for the top of the package. For example, a greater total thickness of liquid material 16 may be required to cover a die 44 having wire bonds protruding upwardly therefrom than if a die 44 is covered before connection to a leadframe. It should also be noted that the total thickness of liquid material 16 over a selected portion of a given die 44 may be altered die by die, again responsive to output of camera 76 or one or more additional cameras 78 or 80, shown in broken lines, detecting the protrusion of unusually high wire bond loops or other features projecting above the active surface of a given die 44 which should be, but is not, covered by the "design" or pre-programmed thickness of liquid material 16 disposed over and at least partially cured on upper die surface 86. In any case, laser 22 is again activated to at least partially cure liquid material 16 residing over each die 44 to form a package top 94 of one or more layers 50, top 94 being substantially contiguous with package side walls 54. Laser beam 28 is controlled as desired to avoid certain surface features on dice 44, such as bond pads, which are intended to be exposed for connection to higher-level packaging by wire bonding, tape automated bonding (TAB) using flex circuits, or the use of projecting conductive connectors such as solder bumps in a "flip-chip" configuration. It should also be noted that the package top 94 may be formed within an outer boundary defined by side walls 54 extending above upper (active) surface 86 and forming a dam thereabout. In this instance, the platform 20 may be submerged so that liquid material 16 enters the area within the dam, raised above surface level 18, and then laser beam 28 activated and scanned to at least partially cure liquid material 16 residing within the dam. Alternatively, a "skin" may be cured by STL over the top surface 86 of the die 44, and liquid polymer material 16 entrapped thereby will be subsequently cured in a final curing step.

Figure 5:
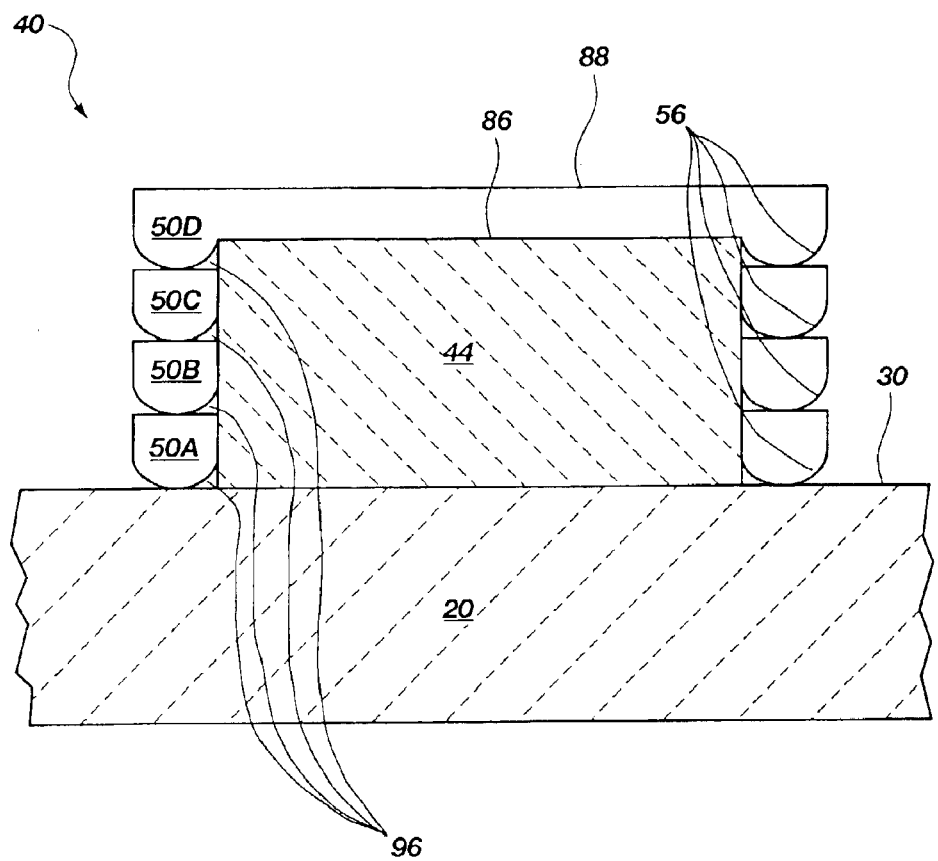
FIG. 5 is a schematic cross-sectional side elevation of a semiconductor die undergoing a stereolithographic packaging step in a method alternate to the method of the present invention.
Figure 6:
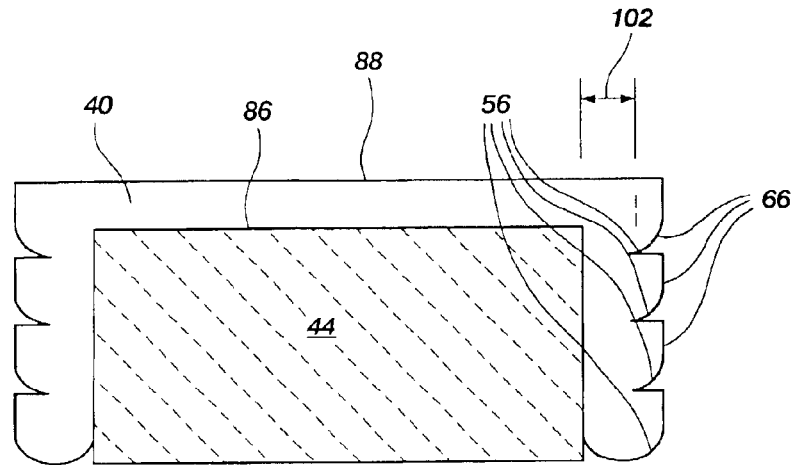
FIG. 6 is a schematic cross-sectional side elevation of a semiconductor die packaged by a stereolithographic packaging method alternative to the method of the present invention.

When the final layer 50, is formed to complete a selected portion of the structure 40, platform 20 is elevated above surface level 18 of liquid material 16 and excess liquid material 16 is drained from the STL-formed structure 40. At this stage, depicted in FIG. 4, the surfaces 66 of vertical sides 54 of the at least partially polymerized structure 40 may be somewhat nonplanar, having linear, slit-like, external horizontal crevices 56 at the interfaces 58 between adjacent layers 50A, 50B, 50C and 50D, as well as between layer 50A and platform 20. A meniscus 60 comprising a quantity of unpolymerized liquid material 16 is retained or trapped within each crevice 56. Where the vertical sides 54 meet the die 44, similar interior crevices 96 may occur along the layer interfaces 58, being filled with unpolymerized liquid photopolymer material 16 which is trapped therein.

Where the initial lack of planarity of the surfaces 66 of the vertical sides 54 may be tolerated, the structure 40 may be washed to remove all unpolymerized liquid material 16 from the external surfaces 30, 66 and 88, including the external crevices 56. The washed structure 40 is shown in FIG. 5, being free of liquid photopolymer material 16 in the external crevices 56. It should be noted that at this stage, the polymer comprising structure 40 is typically in various stages of polymerization, including liquid polymer material 16 trapped in internal crevices 96. Furthermore, the uppermost layer 50D may comprise a polymerized "skin" which traps unpolymerized or partially polymerized liquid material 16 therebelow. Following removal of the structure 40 from the platform 20, a final curing step polymerizes and consolidates the structure 40, including any liquid polymer material 16 in the internal crevices 96 or otherwise trapped within the structure. As exemplified in FIG. 6, empty external crevices 56 remain in the side walls 54 of the package, i.e., structure 40, following removal from the platform 20 and full cure of the structure 40. These crevices 56 reduce the effective side wall thickness 102 (see FIG. 6) and represent potential weaknesses in the packaging. Dust, other debris and moisture may collect in the crevices 56.

The method and apparatus of the present invention pertain to the stereolithographic polymerization of liquid polymer material 16 retained in external crevices 56 shadowed by overlying polymerized layers 50 of a structure 40 formed by STL, whereby the side wall surfaces 66 are made smooth. The smoothing method is enabled by certain modifications to conventional STL apparatus, described infra. The smoothing fills the crevices 56 to a depth approaching the flat side wall surfaces 66, thus removing locations where dust and moisture may collect. Smoothing also increases the effective thickness of the protective layer over the die 44 for uniform protection, increases resistance of the formed structure 40 to damage and environmental contamination by providing a stronger structure, reduces waste of polymeric material, and is aesthetically preferred.

Figure 4:
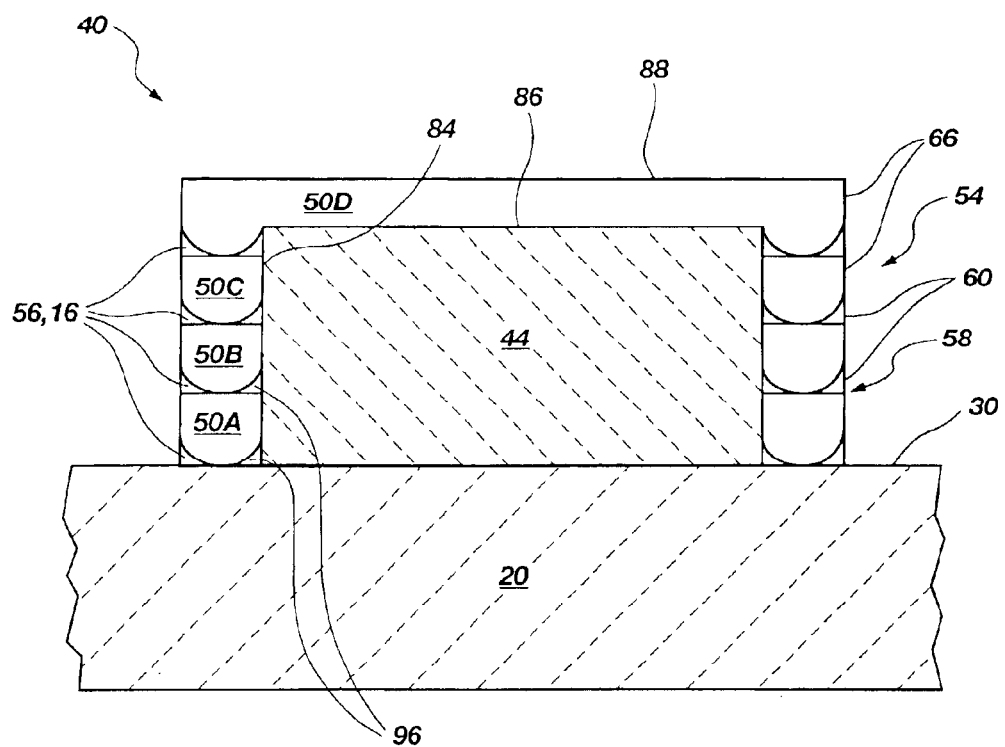
FIG. 4 is a schematic cross-sectional side elevation of a semiconductor die undergoing a stereolithographic packaging step in a method of the present invention.

In accordance with the present invention, removal of the platform 20 with structure 40 from the liquid photopolymer material 16 is followed by draining of excess liquid material 16 therefrom, resulting in the configuration depicted in FIG. 4. Residual liquid photopolymer material 16 retained in the external crevices 56 and having outer meniscus surfaces 60 is not removed.

Figure 7:
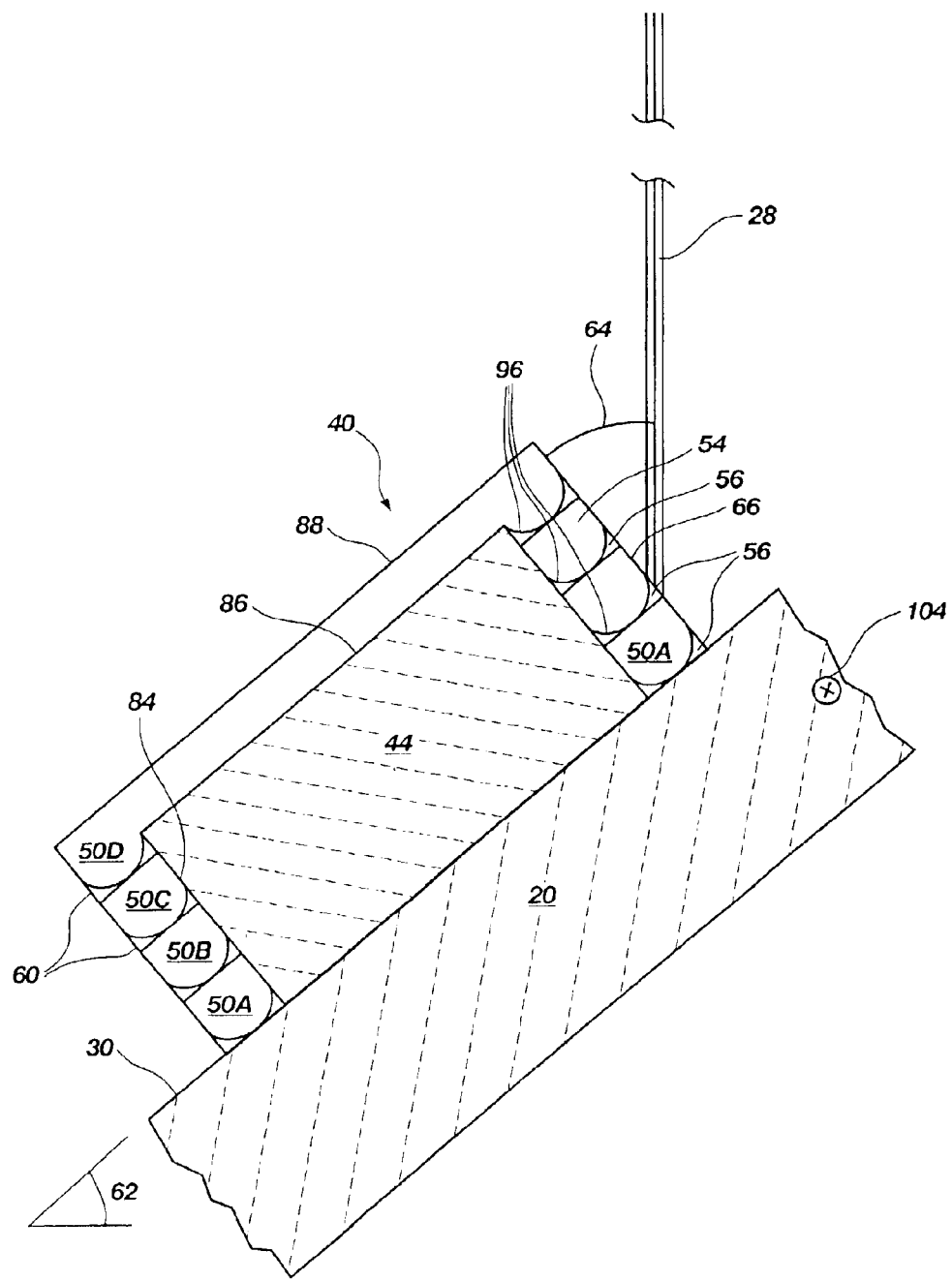
FIG. 7 is a schematic cross-sectional side elevation of a semiconductor die undergoing stereolithographic packaging by the method and apparatus of the present invention.

As shown in FIG. 7, the platform 20 on which the structure 40 is formed over the die 44 is then reoriented or tilted about a horizontal axis 104 to an acute angle 62 from the horizon. Crevice 56 with liquid meniscus 60 in a vertical side 54 is then irradiated by scanning of the laser beam 28 at incidence angle 64 to polymerize the photopolymer. At a minimum, a thin "skin" 98 of partially polymerized material must be formed to contain any additional unpolymerized liquid material 16 during subsequent washing (see FIG. 8). Polymerization of the meniscus liquid material 16 results in a smooth surface 66 of the vertical side 54. The incident laser beam 28 is generally in a vertical orientation, whereby the angle of incidence 64 between beam 28 and the side surface 66 is equal to angle 62, and may be any acute angle between about 5 degrees and about 90 degrees. The preferred angle of incidence 64 is between about 10 degrees and about 60 degrees. The desirable angle of incidence 64 to achieve a smooth, fully polymerized surface 66 depends upon the depth of the crevice 56, the concavity or convexity of the liquid meniscus 60, and the degree to which the liquid meniscus is shadowed by the overlying layer 50.

Figure 8:
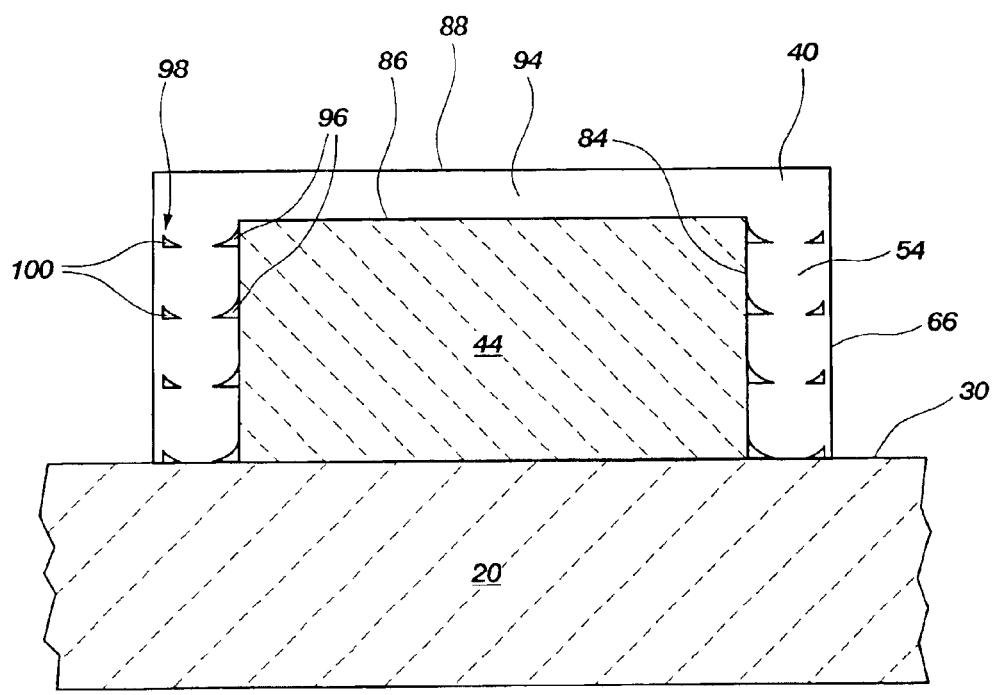
FIG. 8 is a schematic cross-sectional side elevation of a semiconductor die in a step of a stereolithographic packaging method in accordance with the present invention.

As shown in FIG. 8, the side surfaces 66 of structure 40 are smoothed by the tilted STL formation of "skins" 98 of polymerized photopolymer, which typically entrap unpolymerized liquid material 16 in internal pockets 100 in the side walls 54. The formation of a surface skin 98 avoids the use of a high incidence angle 64 such as >60 degrees to reach the innermost portions of the crevices 56 and is achieved with minimum laser energy.

Following the STL smoothing step, any excess uncured liquid material 16 residing on the surfaces of structure 40 may be manually removed and structure 40 may then be solvent-cleaned and removed from platform 20, usually by cutting it free of base supports (not shown). Structure 40 will then be generally subjected to postcuring, as liquid material 16 is typically only partially polymerized and exhibits only a portion (typically 40% to 60%) of its fully cured strength. Postcuring to enhance and accelerate consolidation and complete hardening of structure 40 may be effected in another apparatus projecting broad-source UV radiation in a continuous manner over structure 40, and/or by thermal completion of the initial, UV-initiated partial cure, and/or by other curing means.

Figure 9:
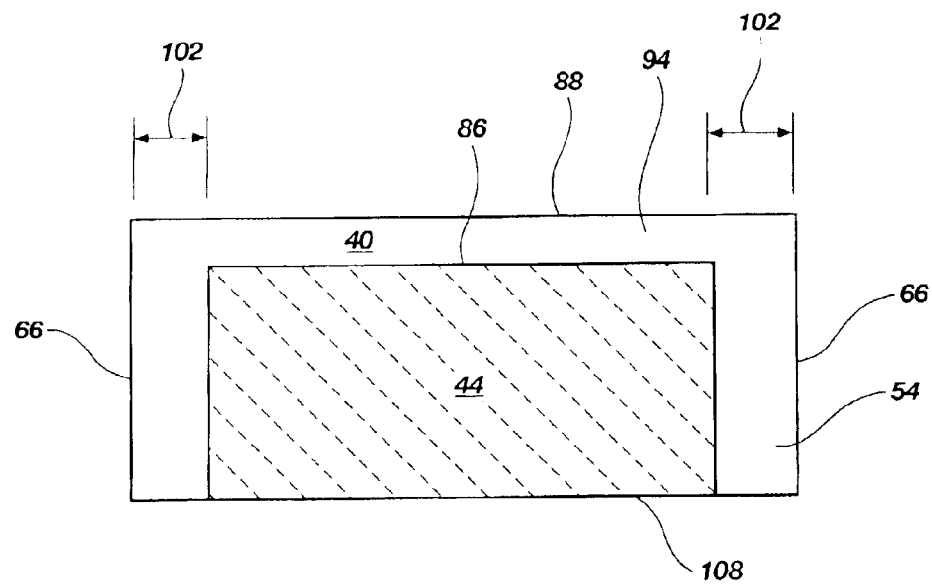
FIG. 9 is a schematic cross-sectional side elevation of a semiconductor die packaged by a stereolithographic packaging method in accordance with the present invention.

In this manner, a structure 40, i.e., the package depicted in FIG. 9, may be formed with smooth, uniform thickness side wall surfaces 66 in minimal time within apparatus 10 and, optionally, a final cure apparatus such as is well known in the art. In instances where a plurality of structures 40 are formed on a relatively large platform 20, it is desirable that platform actuator 36 have the capability of horizontally translating platform 20 above the top of reservoir 14 and while in a tilted position to place tilted walls of each structure 40 directly below laser beam 28.

Figure 10:
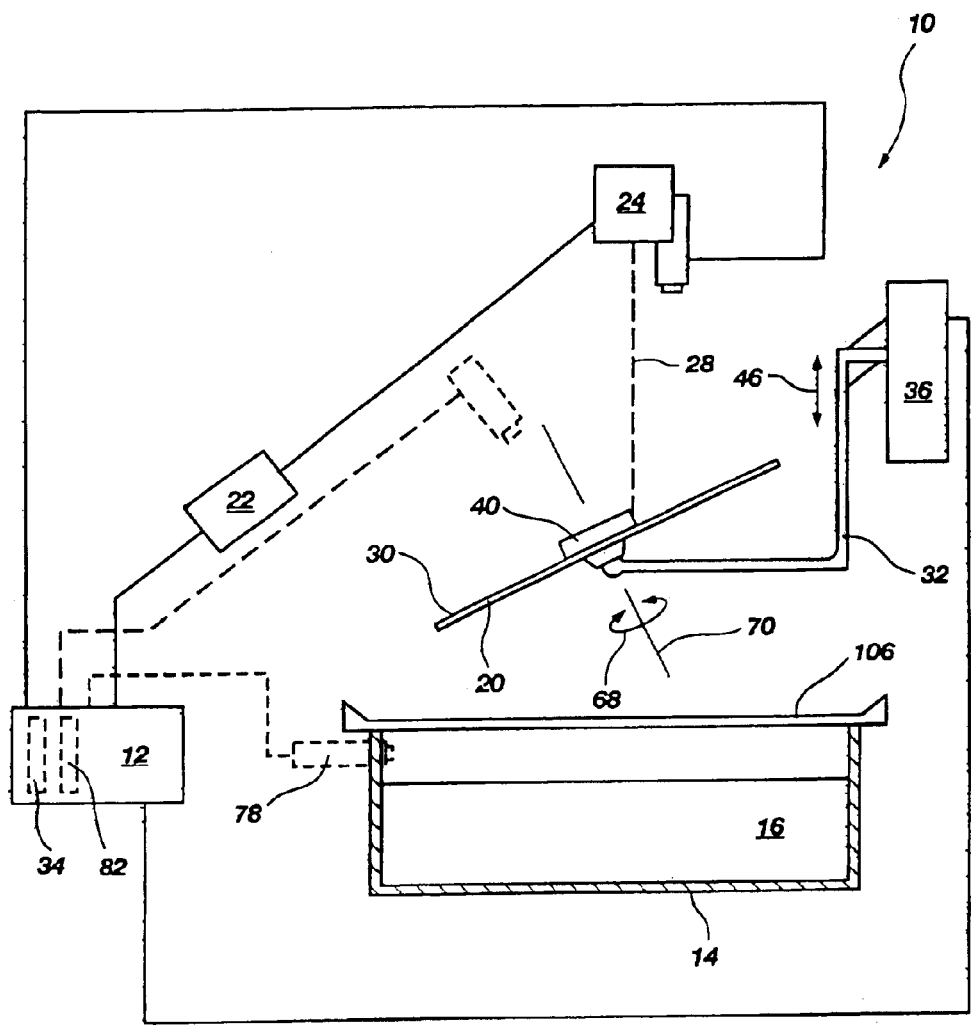
FIG. 10 is a schematic side elevation of an exemplary stereolithographic apparatus modified in accordance with the invention and shown in a wall-smoothing operation of the invention.

In reference to FIGS. 1 and 10, a preferred embodiment of the apparatus 10 includes a platform 20 which is precisely movable in a vertical direction, i.e., along vertical axis Z, and may be tilted vertically about a horizontal axis or axes 104 (see FIG. 7). In a further preferred embodiment, platform 20 is also rotatable about an axis 70 normal to the platform surface 30. Thus, once the platform 20 is tilted to a desired incidence angle, it may then be rotated about axis 70 to present each side wall 54 in turn to the substantially vertical laser beam 28. The laser beam 28 may be scanned over each longitudinal crevice 56 of a selected side wall 54 before the platform 20 rotates for presentation of the next side wall 54. Thus, the number of tilting operations and scanning steps may be minimized. Alternately, the platform 20 may be configured to be first rotated about an axis 70 to a desired position and then tilted about horizontal axis 104. The platform may then be rotated further about axis 70 as desired to present additional side walls 54 to laser beam 28. Alternatively, the platform 20 may be righted to a horizontal position after each side wall 54 facing in a particular direction is exposed to laser beam 28, rotated about axis 70 and then re-tilted.

It should be recognized that where a plurality of structures 40 are formed with varying configurations on a platform 20, an initial tilting step followed by platform rotation and X-Y laser scanning of each object is readily accomplished. The (a) tilting, rotation and Z axis movement of the platform 20 and (b) the scanning operations of the laser beam 28 are both controlled by a computer program using the data file already present in the computer memory 34. As previously described, such data may include, for example, at least one parameter such as the size, configuration, thickness and surface topography of each device to be packaged, together with the construction details of the package to be formed.

The STL smoothing step may be performed by merely lifting the platform 20 above the photopolymer reservoir 14, tilting and scanning within apparatus 10. Incident or reflected laser radiation from the smoothing step may be directed undesirably downwardly into the reservoir 14. Thus, as shown in FIG. 1, an opaque member 106 is provided which is movable across the reservoir 14 to shield liquid photopolymer material 16 from reflected or incident laser radiation during the smoothing step. The opaque member 106 must be opaque to laser radiation and be resistant to damage therefrom. The opaque member 106 may comprise a somewhat flexible roll of material or a rigid plate which slides over the reservoir 14, for example. Where the smoothing step is not performed adjacent the reservoir 14, use of the opaque member 106 is not required. Such is the case if the smoothing step is performed by a separate laser apparatus or the reservoir 14 is removed from STL apparatus 10 prior to the smoothing step.

While the smoothing step has been described above in the context of using a laser beam 28 scanned along crevices 56, it will be appreciated that a broad beam or flood type radiation source of appropriate wavelength or wavelength range may be used to expose liquid photopolymer material 16 in all crevices 56 facing in a given direction at the same time. Moreover, simultaneous exposure of all side walls 54 for smoothing might be accomplished either within or outside apparatus 10 through the use of a plurality of broad beam or flood type radiation sources surrounding and above platform 20 or other supporting platform and facing downwardly at an appropriate angle. Of course, the severity of the angle required for orientation of the radiation sources would depend on the spacing between adjacent structures 40 on platform 20.

While the foregoing example of the invention shows the packaging of a die 44 on the top 86 and sides 84, the die bottom 108 (see FIG. 9) may also be stereolithographically packaged in a variety of configurations to effect substantially complete sealing of the die. For example, the dice 44 may be placed bottom 108 down on an insulative material which will comprise the bottom packaging and STL used to construct the side walls 54 using the insulative material as a base. Alternatively, a package bottom is first formed on the platform 20 by stereolithography, the die 44 is placed on the package bottom, and the STL process is continued to erect the side walls 54. In yet another variation, where a plurality of dice 44 are secured and electrically connected (as by wire bonding, thermocompression bonding, TAB bonding or otherwise as known in the art) to leadframes, the leadframe may be inverted to form the bottom packaging by STL. In still another variation, dice 44 may be encapsulated on five sides and then inverted and encapsulated on the sixth, whether it be a "top," "bottom" or "side." Using machine vision systems, mere inversion of the dice 44 after all but one side of each is covered and reinitiation of laser scanning may be used to complete the packages. If certain die features such as bond pads, solder bumps, etc., are to remain unencapsulated, the apparatus 10 may be programmed to recognize and avoid such features.

While the prior discussion describes the invention in terms of the packaging of the top 86 and four lateral sides 54 of a semiconductor die 44, the method of the present invention is more broadly applicable to the formation of any structure 40 which is formed from a liquid photopolymer material 16 in layers 50 by stereolithography. Thus, the structure 40 may stand alone or be attached to or adjacent to another object such as a die 44. The small size of semiconductor devices makes the use of stereolithography particularly advantageous for forming protective packaging and other structures 40 on devices and electronic substrates.

It is notable that the method of the present invention produces a substantially smooth side wall surface 66 without consuming any additional photopolymer in comparison to not using the inventive method, and in fact, may enable (due to enhanced uniformity of wall thickness) a die package wall to be formed with a reduced thickness 102, further reducing the already small quantity of liquid polymer material 16 consumed in stereolithographic packaging. In addition, the capital equipment expense of transfer molding processes is eliminated and the inventive method is extremely frugal in its use of dielectric encapsulant liquid material 16, since all such material in which cure is not initiated by laser 22 remains in a liquid state in reservoir 14 for use in packaging the next plurality of dice 44 or other objects. Further, since it is no longer necessary to encapsulate dice 44 with packaging of sufficient wall thickness to accommodate relatively large dimensional variations such as those which may be exhibited by wire bond loop heights, the overall volume of packaging material may be smaller in some cases. Also, the package dimensional tolerances achievable through use of the present invention are increased in precision in comparison to transfer molded packaging. Moreover, there is no potential for mold damage, mold wear, or requirement for mold refurbishment. Finally, the extended cure times at elevated temperatures for transfer molded packaging, on the order of, for example, four hours at 175° C., required after removal of batches of dice from the transfer mold cavities, are eliminated. Post-cure of die packages formed according to the present invention may be effected with broad-source UV radiation emanating from, for example, flood lights in a chamber through which dice are moved on a conveyor or in large batches. Curing in an oven at, for example, 160° C., is another option which effects full curing of liquid polymer material 16 in interior crevices 96 and internal pockets 100.

Full curing of unpolymerized liquid material 16 retained in the crevices 56 without a prior skin formation is not practical because, without a prior solvent wash, droplets and films of liquid material persist on the surfaces of the structure 40. As a result, full curing without a prior solvent wash results in substantially nonuniform side wall surfaces 66 and upper surface 88. If the structure 40 is first solvent-washed without "skinning" of the meniscus liquid photopolymer material 16 in crevices 56, the liquid polymer material 16 is washed from the crevices 56 so the crevices remain after full cure.

It should also be noted that the packaging method of the present invention is conducted at substantially ambient temperature, the small beam spot size and rapid traverse of laser beam 28 around and over the structures 40 resulting in negligible thermal stress thereon. Physical stress on structures 40, i.e., the semiconductor dice and associated leadframes and bare wires, is also significantly reduced, in that liquid material 16 is fixed in place and not moved over the dice in a viscous, high-pressure wave front as in transfer molding, followed by cooling-induced stressing of the package. Bond wire sweep is eliminated, as is any tendency to drive particulates in the polymer encapsulant between lead fingers and an underlying portion of the active surface of the die with consequent damage to the integrity of the active surface.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope if the invention.

What is claimed is:

1. A method for stereolithographically fabricating a structure having at least one sidewall, comprising:
    submerging a base having an upper surface in liquid photopolymer material curable in response to exposure to electromagnetic radiation of a selected wavelength to a first depth over the upper surface;
    applying a beam of precisely focused coherent electromagnetic radiation in the form of an ultraviolet (UV) wavelength laser to selected regions of the curable liquid photopolymer material over the upper surface to at least partially consolidate the curable liquid photopolymer material in the selected regions over the upper surface and form a first layer of at least semisolid material defining at least a portion of a sidewall of a height substantially the same as the first depth on the upper surface, the first layer extending substantially parallel to the upper surface and having a greater lateral extent above the upper surface than adjacent thereto, wherein a crevice is defined between at least one side of the first layer and the upper surface and the crevice contains the curable liquid photopolymer material;
    removing the base from the curable liquid photopolymer material, leaving a quantity of the curable liquid photopolymer material in the crevice;
    orienting the base to permit access to the quantity of the curable liquid photopolymer material by the electromagnetic radiation in the form of an ultraviolet (UV) wavelength laser; and
    exposing the quantity of the curable liquid photopolymer material to the electromagnetic radiation in the form of an ultraviolet (UV) wavelength laser to at least partially consolidate at least an outer portion of the quantity of the curable liquid photopolymer material.

2. The method of claim 1, wherein the exposing the quantity of curable liquid photopolymer material to the electromagnetic radiation comprises traversing a beam of the precisely focused coherent electromagnetic radiation in the form of an ultraviolet (UV) wavelength laser along the crevice.

3. The method of claim 1, further comprising, before the removing the base from the curable liquid photopolymer material:
    submerging the base in curable liquid photopolymer material to a second depth over the first layer;
    applying a beam of precisely focused coherent electromagnetic radiation in the form of an ultraviolet (UV) wavelength laser to selected regions of the curable liquid photopolymer material over the first layer to at least partially consolidate the curable liquid photopolymer material in the selected regions to form a second layer of at least semisolid material defining at least another portion of the sidewall of a height substantially the same as the second depth on the first layer, the second layer extending substantially parallel to the first layer and having a greater lateral extent above the first layer than adjacent thereto, wherein another crevice is defined between at least one side of the second layer and the first layer and the another crevice contains the curable liquid photopolymer material;
    after removing the base from the curable liquid photopolymer material, wherein a quantity of the curable liquid photopolymer material remains in each of the crevice and the another crevice, orienting the base; and
    exposing the quantities of the curable liquid photopolymer material in the crevice and the another crevice to the electromagnetic radiation in the form of an ultraviolet (UV) wavelength laser to at least partially consolidate at least an outer portion of the quantities of the liquid photopolymer material in the crevice and the another crevice.

4. The method of claim 3, wherein the exposing the quantities of the curable liquid photopolymer material to the electromagnetic radiation in the form of an ultraviolet (UV) wavelength laser comprises traversing a beam of such electromagnetic radiation in the form of an ultraviolet (UV) wavelength laser along the crevice and the another crevice.

5. A method of stereolithographically fabricating a structure, comprising:

forming a structure comprising a plurality of superimposed, mutually adhered, substantially parallel layers of a photopolymer material curable in response to exposure to electromagnetic radiation in the form of an ultraviolet (UV) wavelength laser in at least a semisolid state, the plurality of layers defining crevices therebetween along at least one wall of the structure; and exposing additional curable photopolymer material in a liquid state within the crevices to the electromagnetic radiation in the form of an ultraviolet (UV) wavelength laser to at least partially consolidate outer portions of the additional curable photopolymer material in the liquid state.

6. The method of claim 5, further comprising forming the structure in a reservoir of the curable photopolymer material in a liquid state and retaining the curable liquid state photopolymer material in the crevices as the plurality of layers of the curable photopolymer material in at least a semisolid state are formed from the curable photopolymer material in a liquid state in the reservoir.

7. The method of claim 5, further comprising reorienting the at least one wall of the structure prior to the exposing the curable photopolymer material in a liquid state within the crevices to the electromagnetic radiation.

8. The method of claim 7, wherein the exposing comprises traversing a beam of the electromagnetic radiation along the crevices.

9. The method of claim 5, wherein the exposing comprises traversing a beam of the electromagnetic radiation along the crevices.

10. The method of claim 5, wherein the at least one wall comprises a plurality of walls facing in different directions, and further comprising sequentially reorienting each of the plurality of walls and exposing the curable liquid state photopolymer material in the crevices of the each of the plurality of walls to the electromagnetic radiation.

11. The method of claim 10, wherein the exposing comprises traversing a beam of the electromagnetic radiation along the crevices.

12. The method of claim 10, wherein the sequentially reorienting comprises tilting the structure with respect to a horizontal axis and rotating the structure about an axis substantially parallel to the plurality of walls.

13. The method of claim 12, wherein the exposing comprises traversing a beam of the electromagnetic radiation along the crevices.

14. The method of claim 10, wherein the sequentially reorienting comprises rotating the structure about an axis substantially parallel to the plurality of walls and tilting the structure about a horizontal axis.

15. The method of claim 14, wherein the exposing comprises traversing a beam of the electromagnetic radiation along the crevices.

* * * * *